(12) United States Patent
Hill et al.

(10) Patent No.: US 7,064,022 B1
(45) Date of Patent: Jun. 20, 2006

(54) METHOD OF FORMING MERGED FET INVERTER/LOGIC GATE

(75) Inventors: Wiley Eugene Hill, Moss Beach, CA (US); Ming-Ren Lin, Cupertino, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 270 days.

(21) Appl. No.: 10/728,844

(22) Filed: Dec. 8, 2003

(51) Int. Cl.
*H01L 21/00* (2006.01)
*H01L 21/84* (2006.01)
*H01L 21/336* (2006.01)
*H01L 21/3205* (2006.01)
*H01L 21/4763* (2006.01)

(52) U.S. Cl. .................. 438/157; 438/283; 438/304; 438/596; 438/696

(58) Field of Classification Search .......... 438/157, 438/283, 304, 596, 696
See application file for complete search history.

(56) References Cited

U.S. PATENT DOCUMENTS

| 6,719,690 B1 * | 4/2004 | Cassily ............... 600/300 |
| 6,764,884 B1 * | 7/2004 | Yu et al. ............... 438/157 |
| 2005/0006666 A1 * | 1/2005 | Yu et al. ............... 257/200 |

* cited by examiner

OTHER PUBLICATIONS

U.S. Appl. No. 10/674,400; filed Oct. 1, 2003; entitled: "Merged FinFET P-Channel/N-Channel Pair", 40 pages.

Digh Hisamoto et al., "FinFET-A Self-Aligned Double-Gate MOSFET Scalable to 20 nm," IEEE Transactions on Electron Devices, vol. 47, No. 12, Dec. 2000, pp. 2320-2325.
Yang-Kyu Choi et al., "Sub-20nm CMOS FinFET Technologies," 2001 IEEE, IEDM, pp. 421-424.
Xuejue Huang et al., "Sub-50 nm P-Channel FinFET," IEEE Transactions on Electron Devices, vol. 48, No. 5, May 2001, pp. 880-886.
Xuejue Huang et al., "Sub 50-nm FinFET: PMOS," 1999 IEEE, IEDM, pp. 67-70.
Yang-Kyu Choi et al., "Nanoscale CMOS Spacer FinFET for the Terabit Era," IEEE Electron Device Letters, vol. 23, No. 1, Jan. 2002, pp. 25-27.

*Primary Examiner*—William M. Brewster
(74) *Attorney, Agent, or Firm*—Harrity & Snyder LLP

(57) ABSTRACT

A method forms a semiconductor device from a device that includes a first source region, a first drain region, and a first fin structure that are separated from a second source region, a second drain region, and a second fin structure by an insulating layer. The method may include forming a dielectric layer over the device and removing portions of the dielectric layer to create covered portions and bare portions. The method may also include depositing a gate material over the covered portions and bare portions, doping the first fin structure, the first source region, and the first drain region with a first material, and doping the second fin structure, the second source region, and the second drain region with a second material. The method may further include removing a portion of the gate material over at least one covered portion to form the semiconductor device.

20 Claims, 29 Drawing Sheets

US 7,064,022 B1

METHOD OF FORMING MERGED FET INVERTER/LOGIC GATE

FIELD OF THE INVENTION

The present invention relates generally to semiconductor manufacturing and, more particularly, to forming FinFET devices.

BACKGROUND OF THE INVENTION

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent structures that have been considered as candidates for succeeding existing planar MOSFETs. In double-gate MOSFETs, two gates may be used to control short channel effects. A FinFET is a double-gate structure that exhibits good short channel behavior. A FinFET includes a channel formed in a vertical fin. The FinFET structure may also be fabricated using layout and process techniques similar to those used for conventional planar MOSFETs.

SUMMARY OF THE INVENTION

Implementations consistent with the principles of the invention merge N-channel and P-channel FinFET devices on a single fin structure. As a result, a maximum density for complimentary FinFET structures can be achieved.

In accordance with the purpose of this invention as embodied and broadly described herein, a method for forming a semiconductor device is provided. The method may include forming a fin structure; forming a source region at one end of the fin structure; forming a drain region at an opposite end of the fin structure; and forming an insulating layer in the fin structure, source region, and drain region, where the insulating layer separates the fin structure into a first fin structure and second fin structure, the source region into a first source region and a second source region, and the drain region into a first drain region and a second drain region. The first fin structure, the first source region, and the first drain region are formed on an opposite side of the insulating layer to the second fin structure, the second source region, and the second drain region. The method may further include forming a gate dielectric layer on surfaces of the first and second fin structures, the first and second source regions, the first and second drain regions, and the insulating layer; removing portions of the gate dielectric layer to create covered portions and bare portions; depositing a gate material over the covered portions and bare portions; doping the first fin structure, the first source region, and the first drain region with a first material; doping the second fin structure, the second source region, and the second drain region with a second material; and selectively removing portions of the gate material to form the semiconductor device.

In another implementation consistent with the present invention, a method for forming a semiconductor device from a device that includes a first source region, a first drain region, and a first fin structure that are separated from a second source region, a second drain region, and a second fin structure by an insulating layer is provided. The method may include forming an oxide layer over the device; removing portions of the oxide layer to create alternating covered portions and bare portions; depositing a gate material over the alternating covered portions and bare portions; doping the first fin structure, the first source region, and the first drain region with a first material; doping the second fin structure, the second source region, and the second drain region with a second material; and removing a portion of the gate material above the insulating layer and over at least one covered portion to form the semiconductor device.

In yet another implementation consistent with the principles of the invention, a method for forming a semiconductor device from a device that includes a first source region, a first drain region, and a first fin structure that are separated from a second source region, a second drain region, and a second fin structure by an insulating layer is provided. The method may include forming a dielectric layer over the device and removing portions of the dielectric layer to create covered portions and bare portions. The method may also include depositing a gate material over the covered portions and bare portions, doping the first fin structure, the first source region, and the first drain region with a first material, and doping the second fin structure, the second source region, and the second drain region with a second material. The method may further include removing a portion of the gate material over at least one covered portion to form the semiconductor device.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the principles of the invention form multiple transistors in small amounts of space to achieve increased transistor density.

Exemplary Processing

Figure 1:
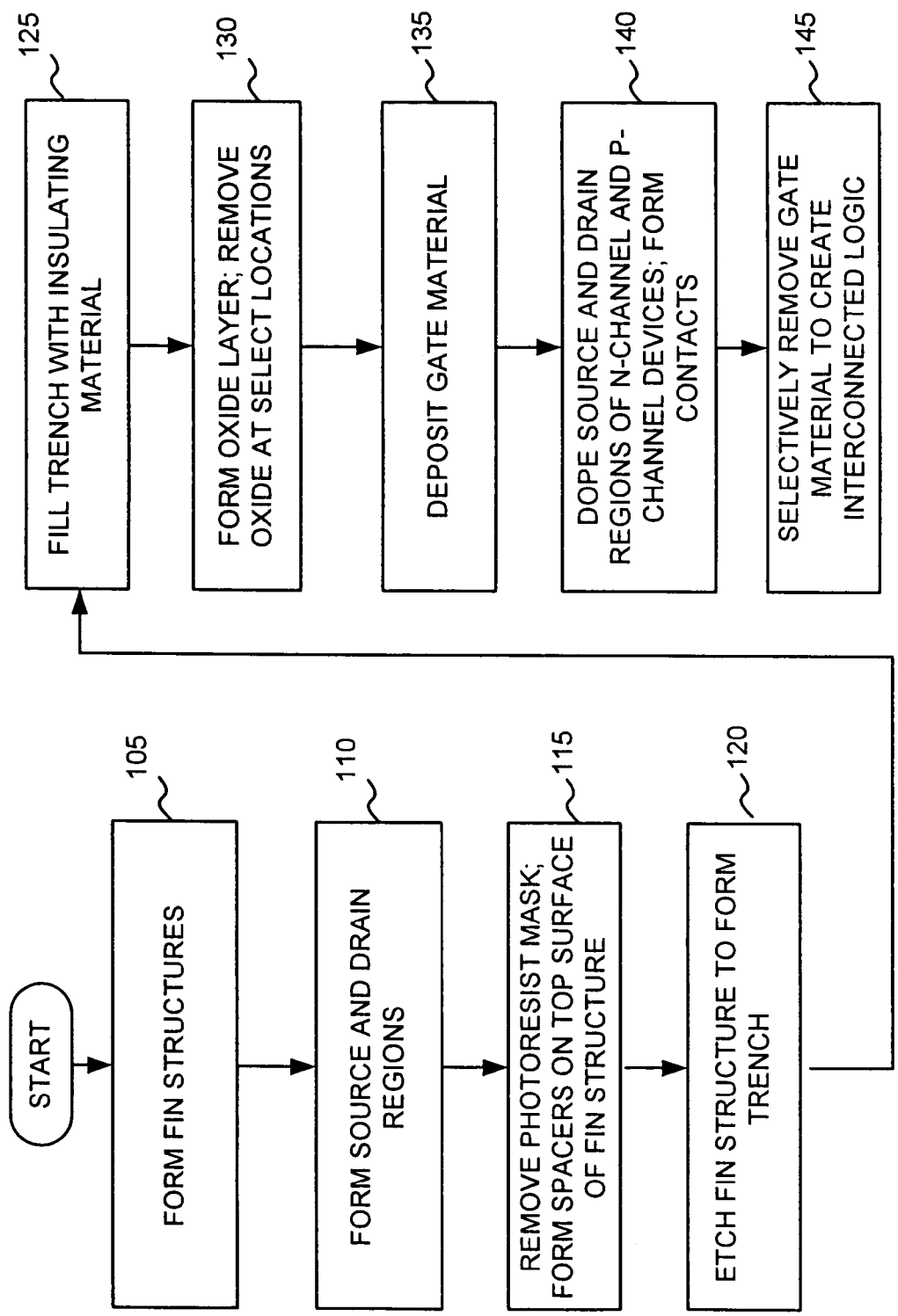
FIG. 1 illustrates an exemplary process for forming a merged N-channel/P-channel FinFET device in an implementation consistent with the principles of the invention.

FIG. 1 illustrates an exemplary process for forming a merged N-channel/P-channel FinFET device in an implementation consistent with the principles of the invention. FIGS. 2–16 illustrate exemplary views of a merged N-channel/P-channel FinFET device fabricated according to the processing described in FIG. 1. The fabrication of one merged N-channel/P-channel FinFET device will be described hereinafter. It will be appreciated, however, that the techniques described herein are equally applicable to forming more than one merged N-channel/P-channel FinFET device.

Figure 2:
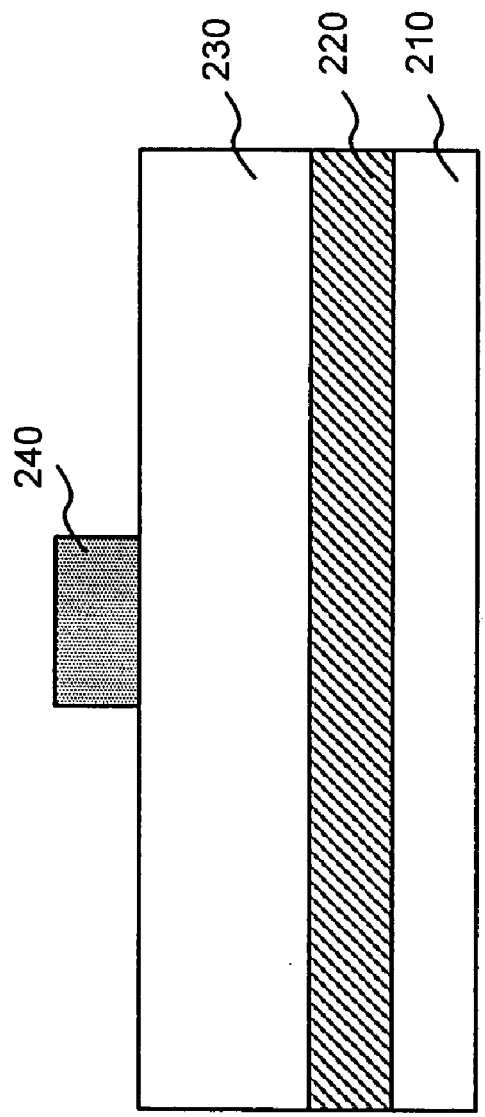
FIGS. 2–16 illustrate exemplary views of a merged N-channel/P-channel FinFET device fabricated according to the processing described in FIG. 1.

With reference to FIGS. 1 and 2, processing may begin with a semiconductor device 200 that includes a silicon-on-insulator (SOI) structure having a silicon substrate 210, a buried oxide layer 220, and a silicon layer 230 on buried oxide layer 220. Buried oxide layer 220 and silicon layer 230 may be formed on substrate 210 in a conventional manner.

In an exemplary implementation, buried oxide layer 220 may include a silicon oxide and may have a thickness ranging from about 1500 Å to about 3000 Å. Silicon layer 230 may include monocrystalline or polycrystalline silicon having a thickness ranging from about 200 Å to about 1000 Å. Silicon layer 230 is used to form a fin structure, as described in more detail below.

In alternative implementations consistent with the present invention, substrate 210 and layer 230 may comprise other semiconducting materials, such as germanium, or combinations of semiconducting materials, such as silicon-germanium. Buried oxide layer 220 may also include other dielectric materials.

A photoresist material may be deposited and patterned to form a photoresist mask 240 for subsequent processing, as illustrated in FIG. 2. The photoresist material may be deposited and patterned in any conventional manner.

Figure 3A:
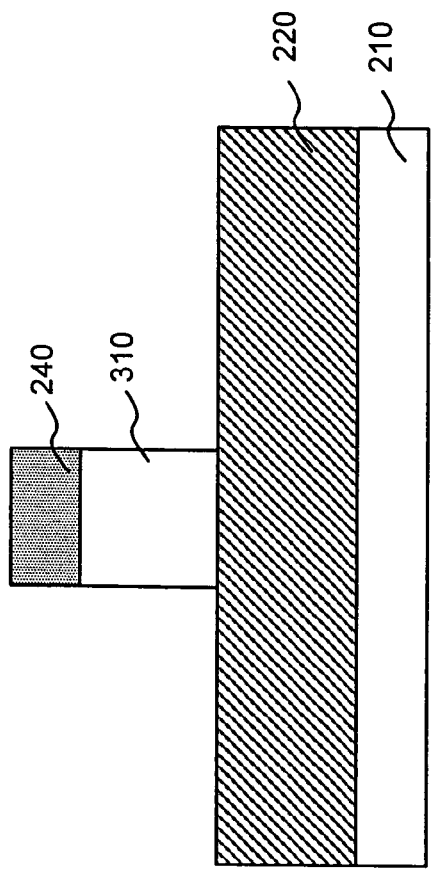

Semiconductor device 200 may then be etched to form a fin structure 310, as illustrated in FIG. 3A (act 105). In an exemplary implementation, silicon layer 230 may be etched in a conventional manner, with the etching terminating on buried oxide layer 220. The portion of silicon layer 230 located under photoresist mask 240 has not been etched, thereby forming a fin structure 310 comprising silicon. In exemplary implementations, the width of fin structure 310 may range from about 70 Å to about 80 Å. In one implementation, the width of fin structure 310 may be approximately 75 Å.

Figure 3B:
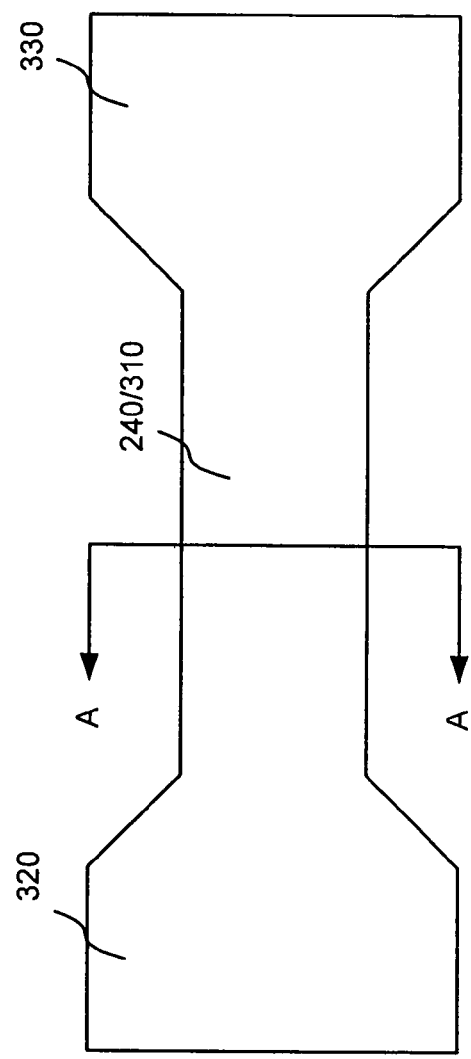

After the formation of fin structure 310, source and drain regions may be formed adjacent the respective ends of fin structure 310 (act 110). For example, in an exemplary implementation, a layer of silicon, germanium or combination of silicon and germanium may be deposited, patterned and etched in a conventional manner to form source and drain regions. Alternatively, silicon layer 230 may be patterned and etched to form source and drain regions. FIG. 3B illustrates an exemplary top view of semiconductor 200 including source region 320 and drain region 330 formed adjacent fin structure 310 on buried oxide layer 220. The buried oxide layer and the photoresist mask are not illustrated in FIG. 3B for simplicity.

Figure 4:
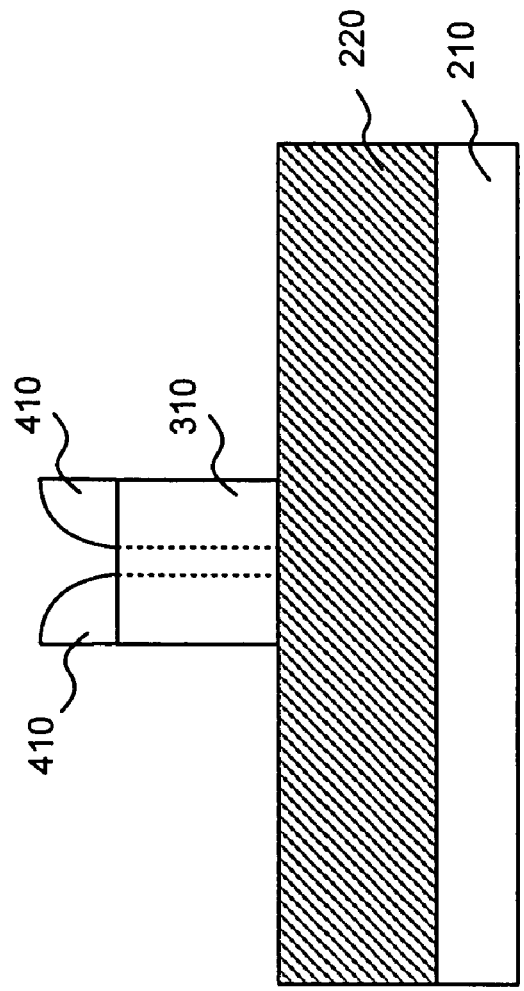

Photoresist mask 240 may then be removed (act 115). Spacer structures 410 may be formed in a conventional manner on a top surface of fin structure 310, as illustrated in FIG. 4 (act 115). The cross-section illustrated in FIG. 4 is taken along line AA in FIG. 3B. In an exemplary implementation, an oxide (or other material) may be deposited over semiconductor device 200 and etched to form spacer structures 410. According to an exemplary implementation consistent with the principles of the invention, spacer structures 410 may be formed to expose a portion of fin structure 310 illustrated by the dotted lines in FIG. 4. The width of the exposed portion of fin structure 310 may range from about 20 Å to about 30 Å. In one implementation, the width of the exposed portion of fin structure 310 may be approximately 25 Å.

Figure 5:
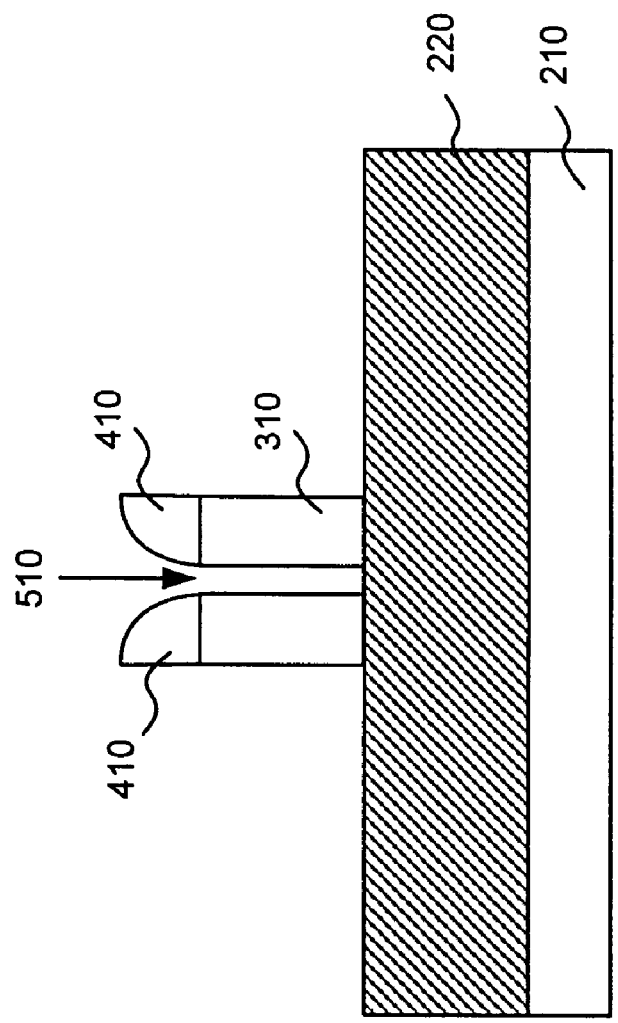

The exposed portion of fin structure 310 may then be etched to form a trench 510, with the etching terminating on buried oxide layer 220, as illustrated in FIG. 5 (act 120). In exemplary implementations, the width of trench 510 may range from about 20 Å to about 30 Å. In one implementation, the width of trench 510 may be approximately 25 Å.

Figure 6:
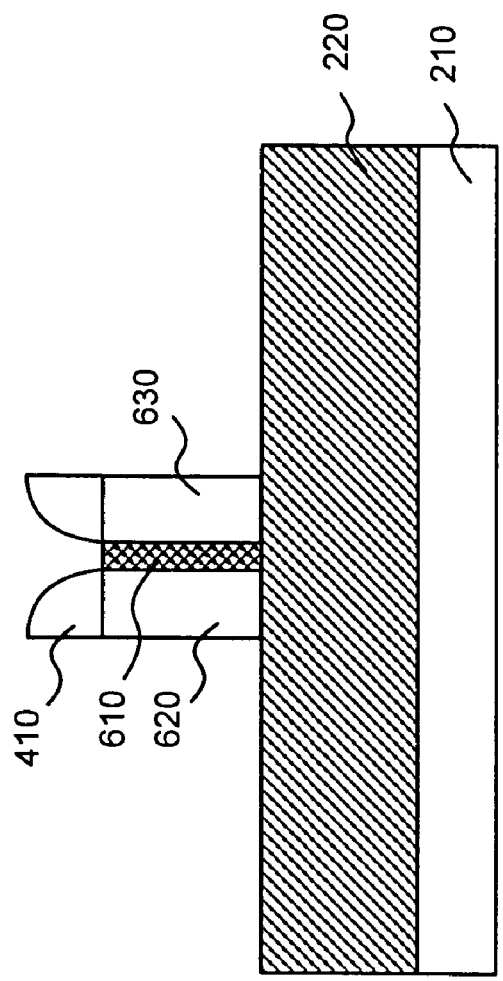

An insulating layer 610 may be deposited to fill trench 510, as illustrated in FIG. 6 (act 125). Insulating layer 610 may comprise an oxide or a high K dielectric material, such as, for example, $TiO_2$ or $Ta_2O_5$. As will be described in more detail below, insulating layer 610 acts to divide source and drain regions 320 and 330 into two separate source regions and two separate drain regions. Moreover, insulating layer 610 may, in essence, divide fin structure 310 into separate fin structures 620 and 630. In exemplary implementations, the width of each fin structure 620/630 may range from about 20 Å to about 30 Å. In one implementation, the width of the each fin structure 620/630 may be approximately 25 Å.

Figure 7A:
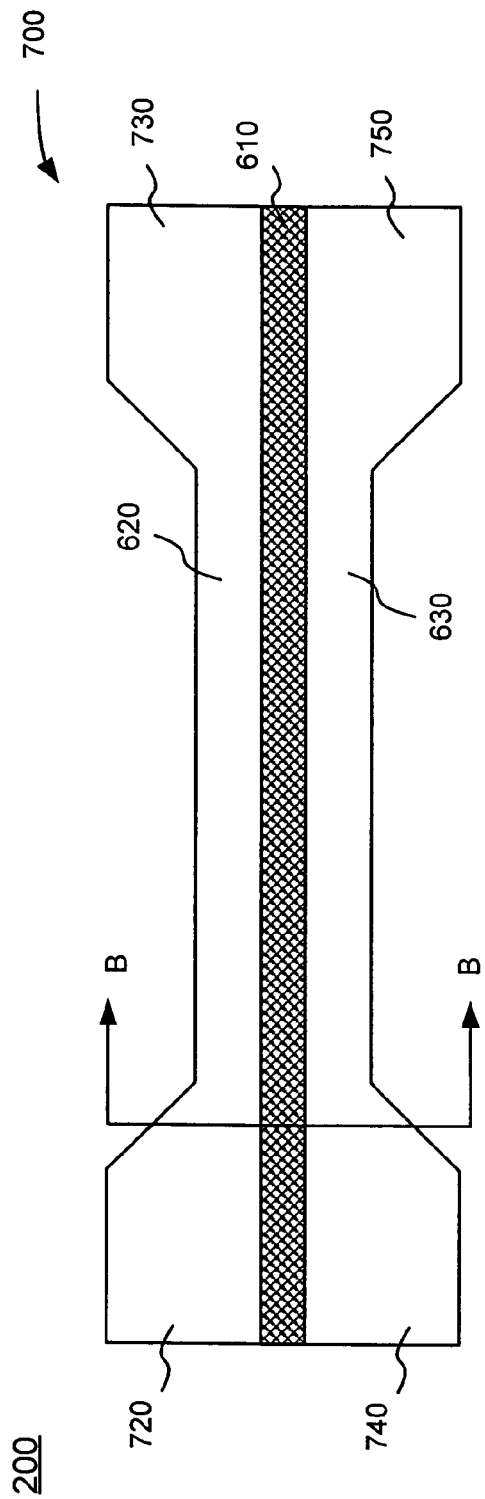
Figure 7B:
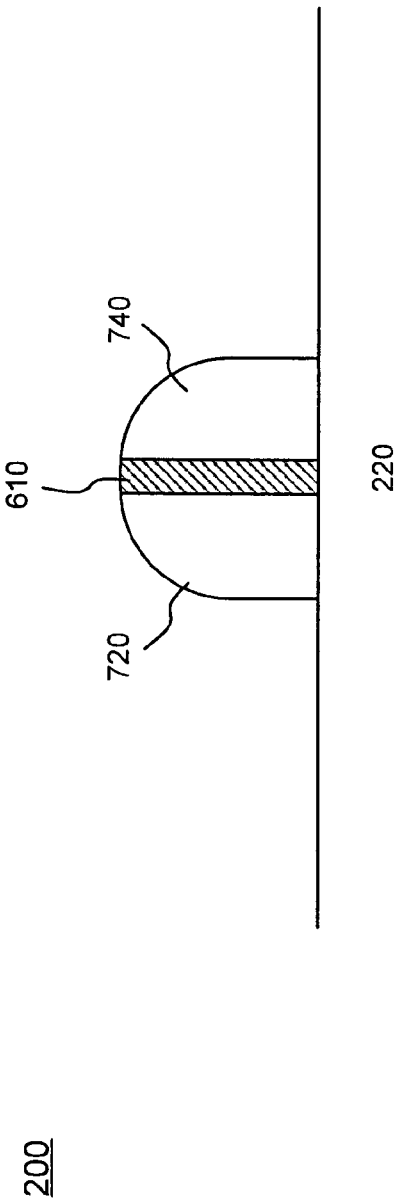

After insulating layer 610 is deposited, spacer structures 410 may be removed, as illustrated in FIGS. 7A and 7B, leaving two devices 700 and 705 separated by insulating layer 610. During the removal of spacer structures 410, a portion of fin structures 620/630 may also be removed. For example, the top surfaces of fin structures 620/630 may become rounded as a result of removing spacer structures 410. Device 700 includes source region 720, fin structure 620, and drain region 730. Device 705 includes source region 740, fin structure 630, and drain region 750. It will be appreciated that the technique described above for forming devices 700 and 705 is provided for explanatory purposes only. Other techniques may alternatively be used to form devices 700 and 705.

Figure 8:
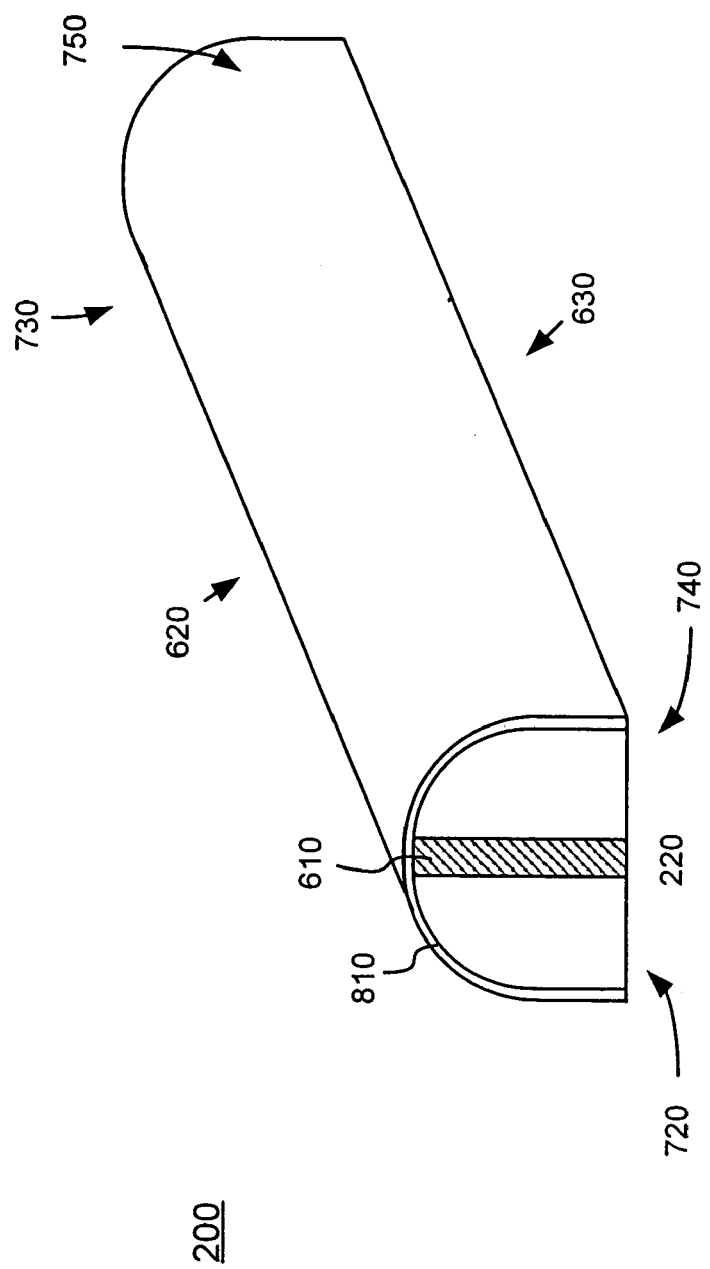

A gate dielectric layer 810 may be deposited or thermally grown on semiconductor device 200, as illustrated in FIG. 8 (act 130). Gate dielectric layer 810 may be formed at a thickness ranging from about 10 Å to about 30 Å. Gate dielectric layer 810 may include conventional dielectric materials, such as an oxide (e.g., silicon dioxide). In other implementations, a nitride material, such as a silicon nitride, may be used as the gate dielectric material.

Figure 9:
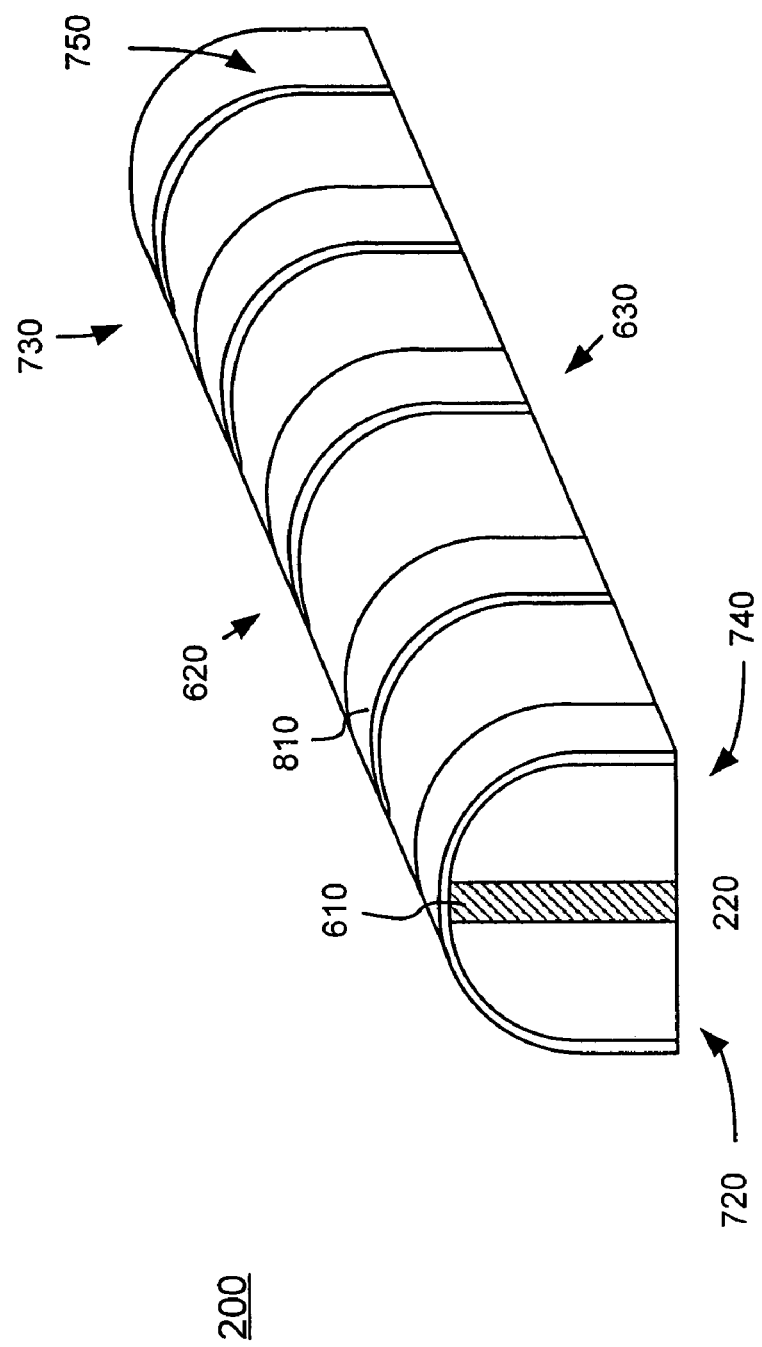

Gate dielectric layer 810 may then be selectively removed, as illustrated in FIG. 9, to thereby form strips of gate dielectric material on semiconductor device 200 (act 130). Gate dielectric layer 810 may be removed via etching or other conventional technique. The strips of gate dielectric material 810 may have a width ranging from about 100 Å to about 1000 Å. In one implementation, the width of each strip of gate dielectric material 810 may be approximately 1000 Å.

Figure 10:
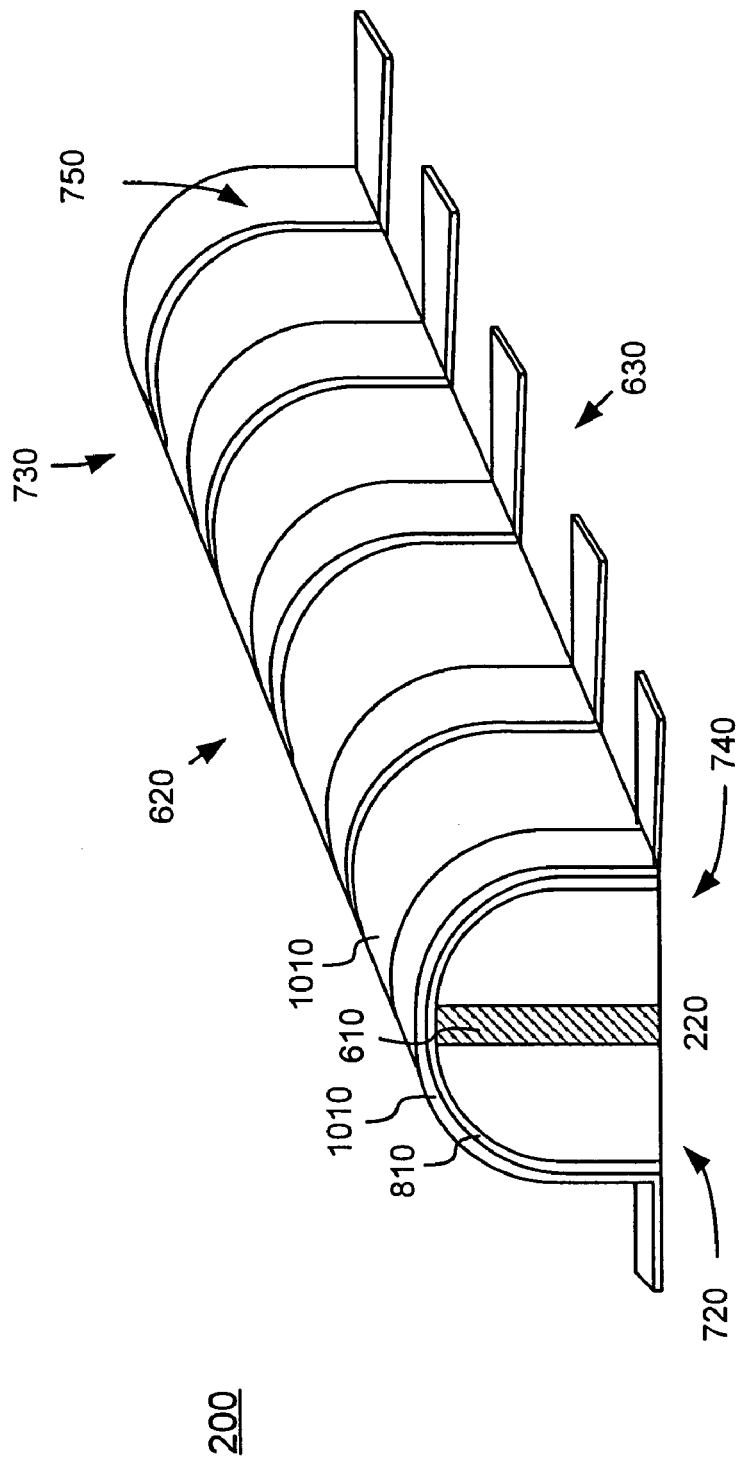

A gate material layer 1010 may then be deposited over semiconductor device 200, as illustrated in FIG. 10 (act 135). In an exemplary implementation, gate material layer 1010 may include polysilicon deposited using conventional chemical vapor deposition (CVD) to a thickness ranging from about 200 Å to about 1000 Å. Alternatively, other semiconducting materials, such as germanium or combinations of silicon and germanium, or various metals may be used as the gate material.

As set forth above, insulating layer 610 causes two separate source regions 720 and 740 to be formed, along with two separate drain regions 730 and 750 (FIG. 7A). In this way, an N-channel transistor device can be formed on one side of insulating material 610 (e.g., including source region 740 and drain region 750) and a P-channel transistor device can be formed on the opposite side of insulating material 610 (e.g., including source region 720 and drain region 730).

Source/drain regions 720, 730, 740, and 750 may then be doped with n-type or p-type impurities based on the particular end device requirements (act 140). In exemplary implementations consistent with the principles of the invention, source region 720 and drain region 730 of the P-channel device may be doped with p-type impurities and source region 740 and drain region 750 of the N-channel device may be doped with n-type impurities.

Figure 11:
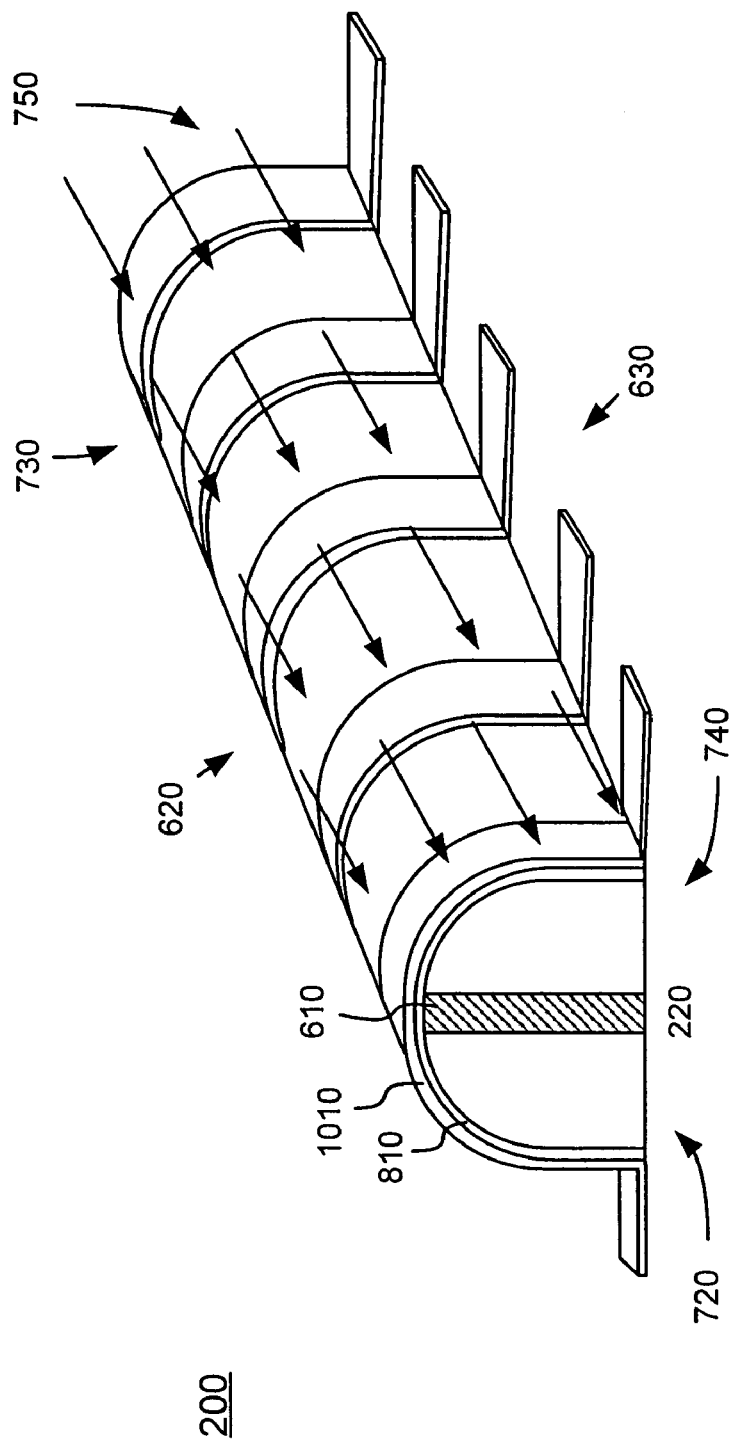

For example, a conventional implant process of n-type impurities, such as arsenic or phosphorus, may be performed to dope source region 740 and drain region 750, as illustrated in FIG. 11. The n-type impurities may be implanted at a tilt angle ranging from approximately 10 degrees to 80 degrees. In an exemplary implementation, the implant process may be performed at an angle of approximately 30 degrees. Using a tilt angle ensures that source and drain regions 720 and 730 will not be doped during this first ion implantation process.

In an exemplary implementation, phosphorus may be implanted at a dosage of about $5 \times 10^{14}$ atoms/cm$^2$ to about $1 \times 10^{15}$ atoms/cm$^2$ and an implantation energy of about 3 KeV to about 6 KeV, which may depend on the thickness of source region 740 and drain region 750 and the desired junction depths for source/drain regions 740 and 750. In an alternative implementation, arsenic may be implanted at a dosage of about $5 \times 10^{14}$ atoms/cm$^2$ to about $1 \times 10^{15}$ atoms/cm$^2$ and an implantation energy of about 5 KeV to about 10 KeV, which may depend on the thickness of source region 740 and drain region 750 and the desired junction depths for source/drain regions 740 and 750.

Figure 12:
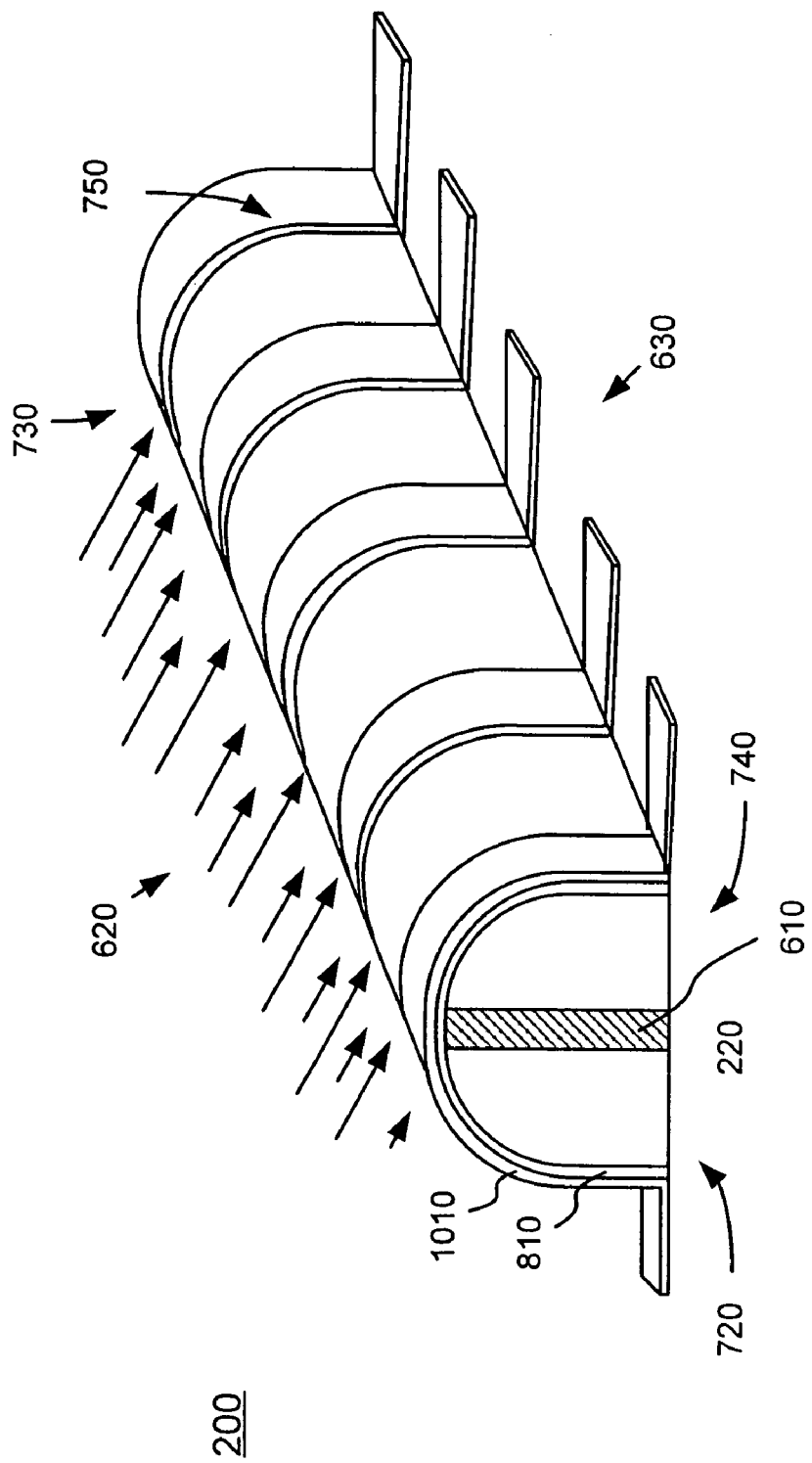

A tilt angle implant process of p-type impurities, such as boron or BF$_2$, may be performed to dope source region 720 and drain 730, as illustrated in FIG. 12. The p-type impurities may be implanted at an angle ranging from approximately 10 degrees to 80 degrees. In an exemplary implementation, the implant process may be performed at an angle of approximately 30 degrees.

The p-type impurities may be implanted at a dosage of about $5 \times 10^{14}$ atoms/cm$^2$ to about $1 \times 10^{15}$ atoms/cm$^2$ and an implantation energy of about 2 KeV to about 3 KeV, which may depend on the thickness of source region 720 and drain region 730 and the desired junction depths for the source/drain regions. The above implant processes may alter the work function of gate material 1010 in the N-channel region and the P-channel region to achieve desirable threshold voltages for the resulting N-channel and P-channel devices.

It will be appreciated that sidewall spacers may optionally be formed prior to the source/drain ion implantation processes described above to control the location of the source/drain junctions based on the particular circuit requirements. A salacide process may then be performed in a well-known manner to form contacts to source regions 720/740 and drain regions 730/750 (act 140).

Figure 13:
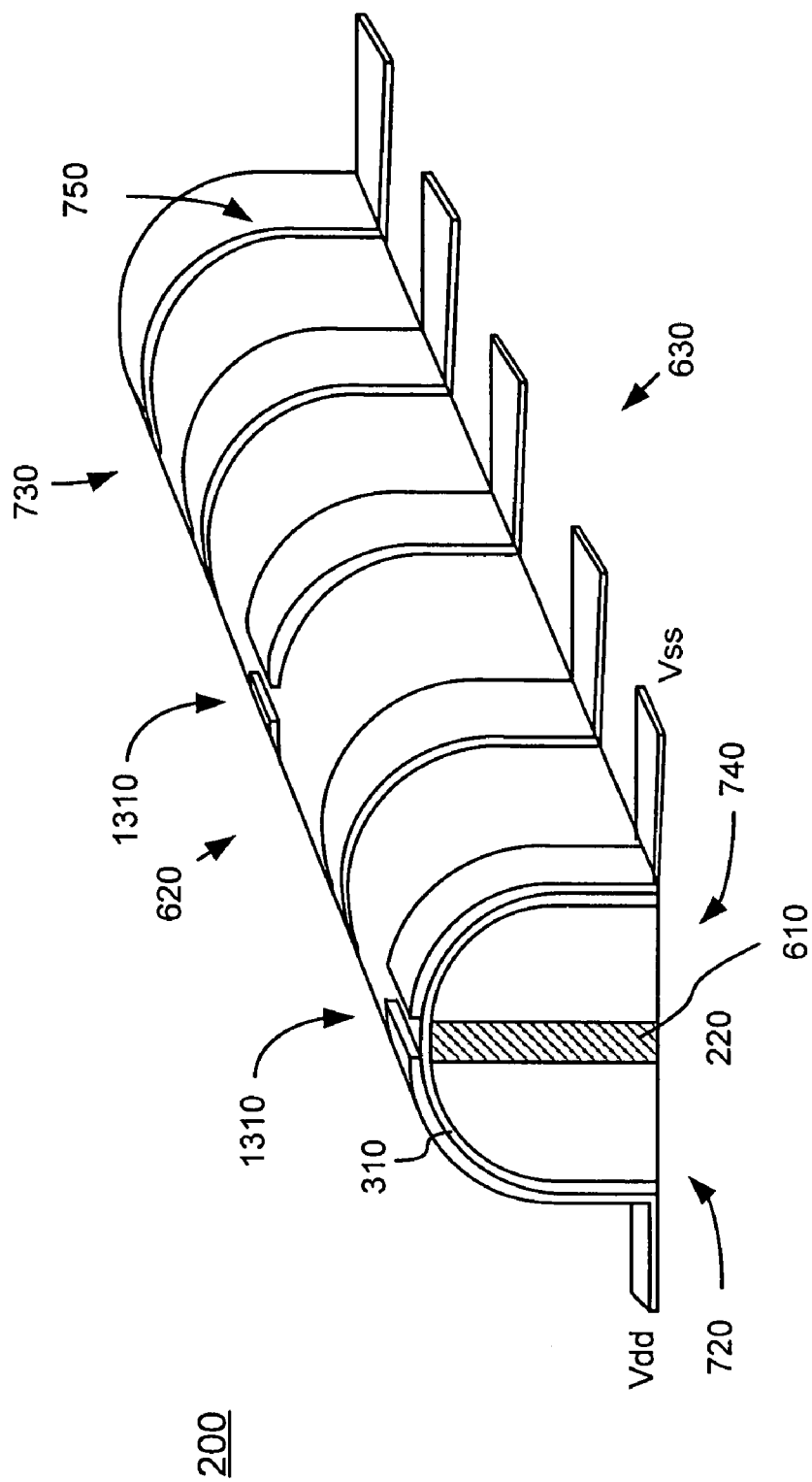
Figure 14:
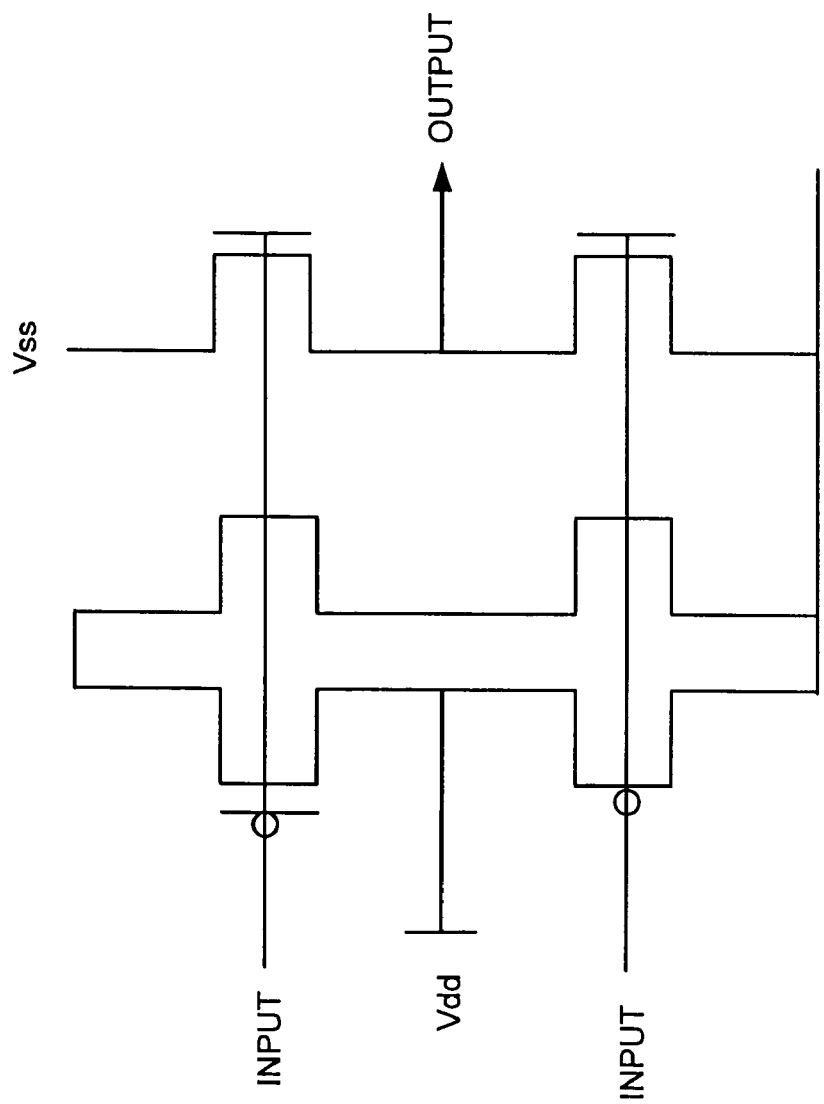

Gate material 1010 may then be selectively etched, as illustrated in FIG. 13 (act 145). In one implementation, a portion of gate material 1010 above insulating layer 610 may be selectively removed to isolate gate material 1010 at select locations 1310 in device 200. For example, a portion of gate material 1010 above insulating layer 610 in the source region of semiconductor device 200 may be removed to form electrical contacts for Vdd and Vss, as illustrated in FIG. 13. The distance between the isolated portions of gate material 1010 may range from about 500 Å to about 2000 Å. As a result of the above processing, an N-channel/P-channel transistor device may be formed in a small amount of space to achieve increased transistor density. For example, a two-input NAND gate device 200 may be formed, as illustrated in FIG. 14.

Figure 15:
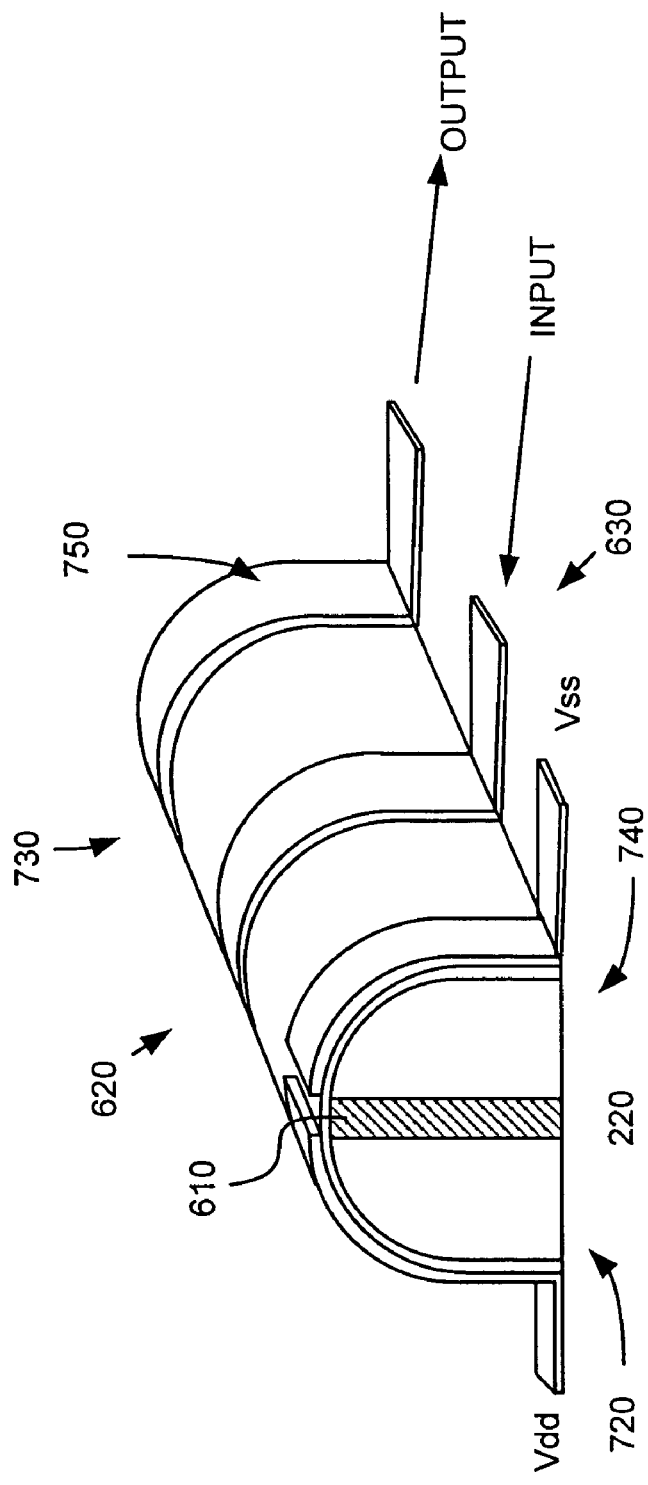
Figure 16:
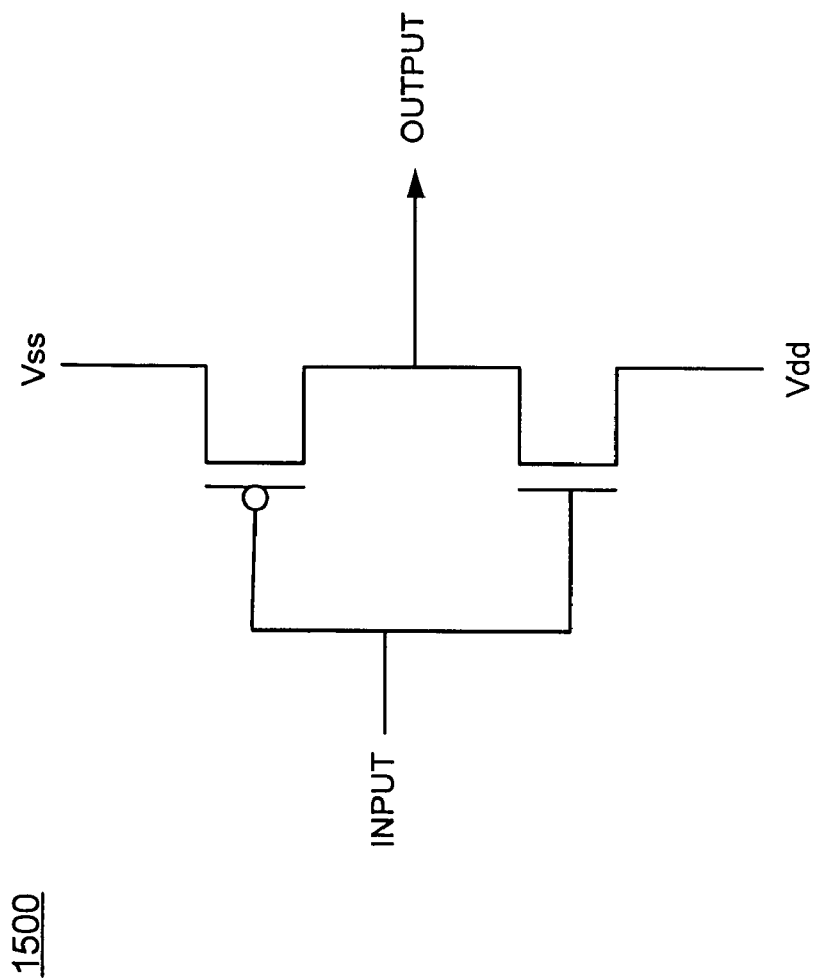

Other transistor devices, such as inverters, NOR gate devices, or other NAND gate devices, may alternatively be formed in a small amount of space, as one skilled in the art will appreciate based on the technique described above. For example, an inverter 1500 may be formed as illustrated in FIGS. 15 and 16.

The present invention has been described above as merging N-channel and P-channel FinFET devices on a single fin structure. As a result, a maximum density for complimentary FinFET structures can be achieved.

Other Implementation

Figure 17:
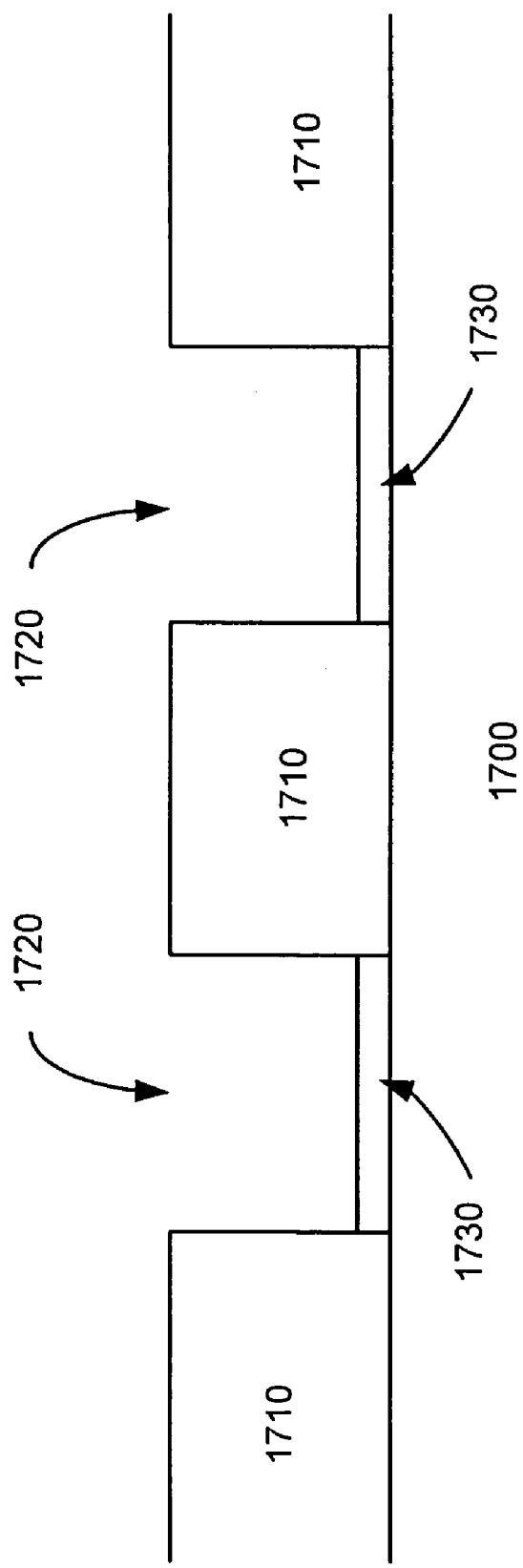
FIGS. 17–27 illustrate exemplary views for creating a static random access memory (SRAM) device according to an alternative implementation consistent with the principles of the invention.

FIGS. 17–27 illustrate exemplary views for creating a SRAM device according to an alternative implementation consistent with the principles of the invention. With reference to FIG. 17, processing may begin with a semiconductor device that includes a silicon substrate 1700 and a buried oxide layer 1710. Buried oxide layer 1710 may be formed on substrate 1700 in a conventional manner. In an exemplary implementation, buried oxide layer 1710 may include a silicon oxide and may have a thickness ranging from about 1500 Å to about 3000 Å.

In alternative implementations consistent with the present invention, substrate 1700 may comprise other semiconducting materials, such as germanium, or combinations of semiconducting materials, such as silicon-germanium. Buried oxide layer 1710 may also include other dielectric materials.

One or more trenches 1720 may be formed in oxide layer 1710 in a conventional manner, as shown in FIG. 17. In one implementation, two trenches 1720 may be formed via etching. Polysilicon 1730 may be deposited in trenches 1720 to a thickness ranging from about about 200 Å to about 1000 Å using conventional CVD.

Figure 18:
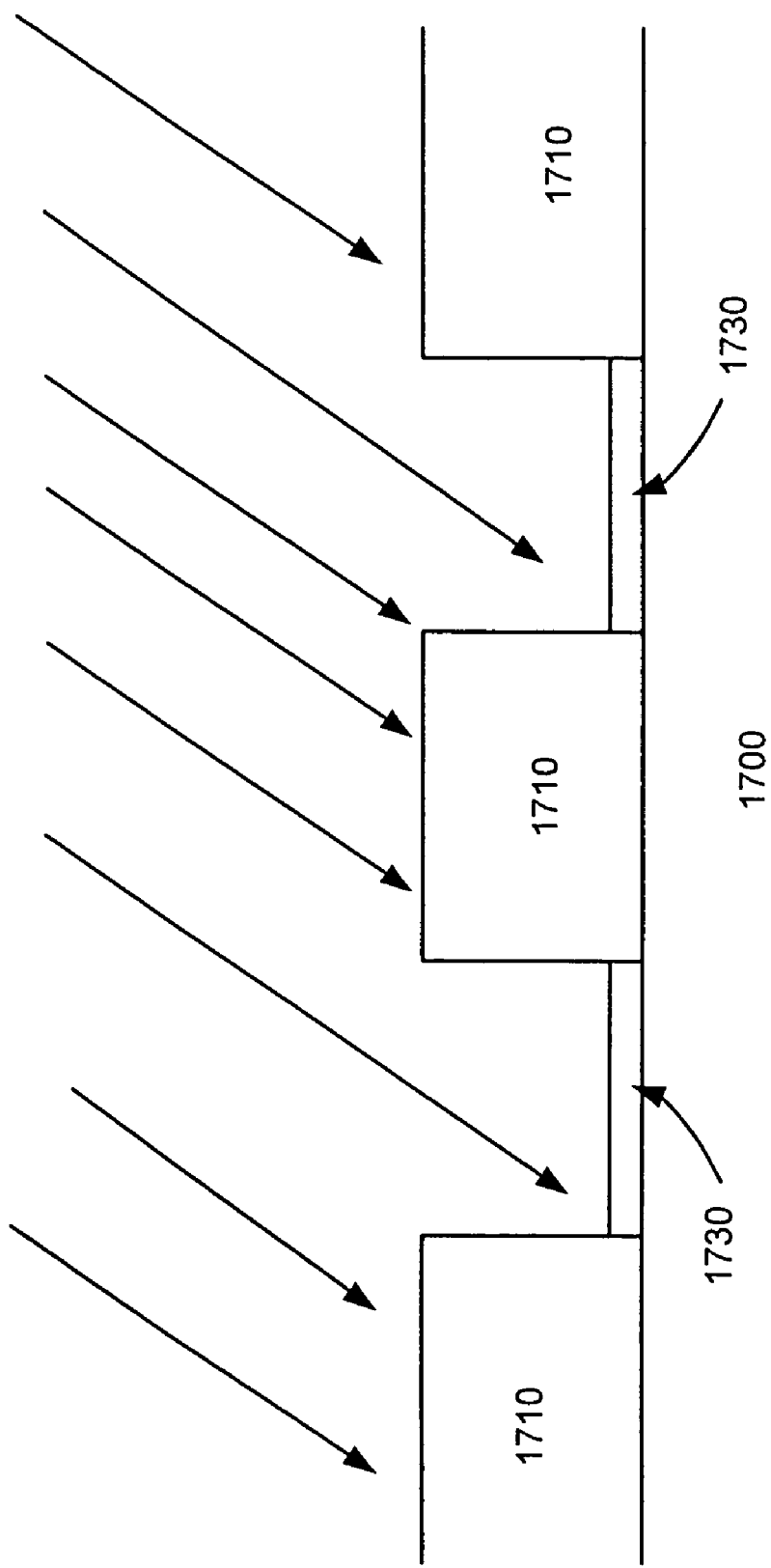
Figure 19:
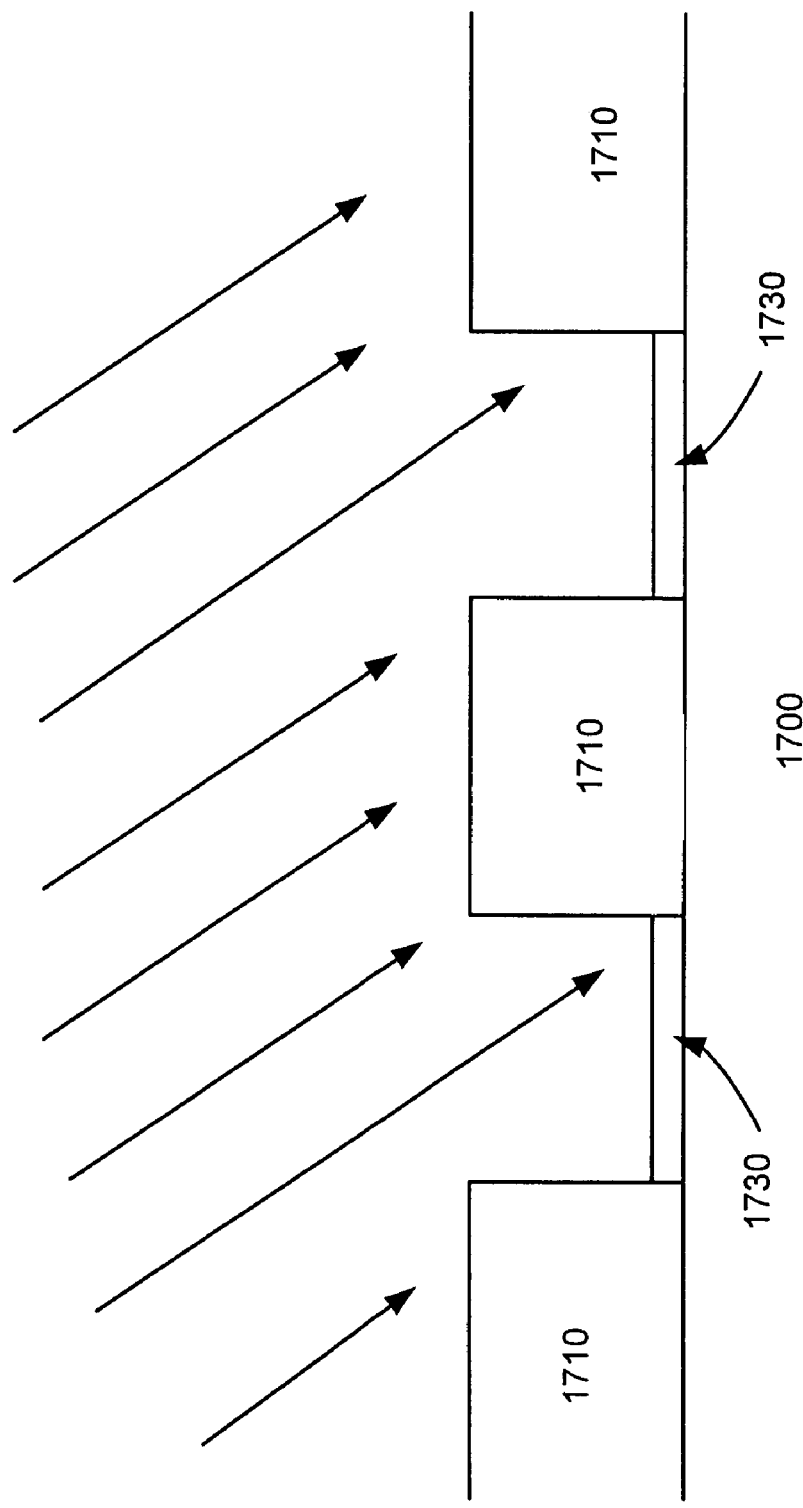

The semiconductor device may then be doped with n-type and p-type impurities based on the particular end device requirements. In exemplary implementations consistent with the principles of the invention, the semiconductor device may be doped with n-type impurities, such as arsenic or phosphorus, at a tilt angle ranging from approximately 10 degrees to 80 degrees, as illustrated in FIG. 18. Similarly, the semiconductor device may be doped with p-type impurities, such as boron or BF$_2$, at a tilt angle ranging from approximately 10 degrees to 80 degrees, as illustrated in FIG. 19.

Figure 20:
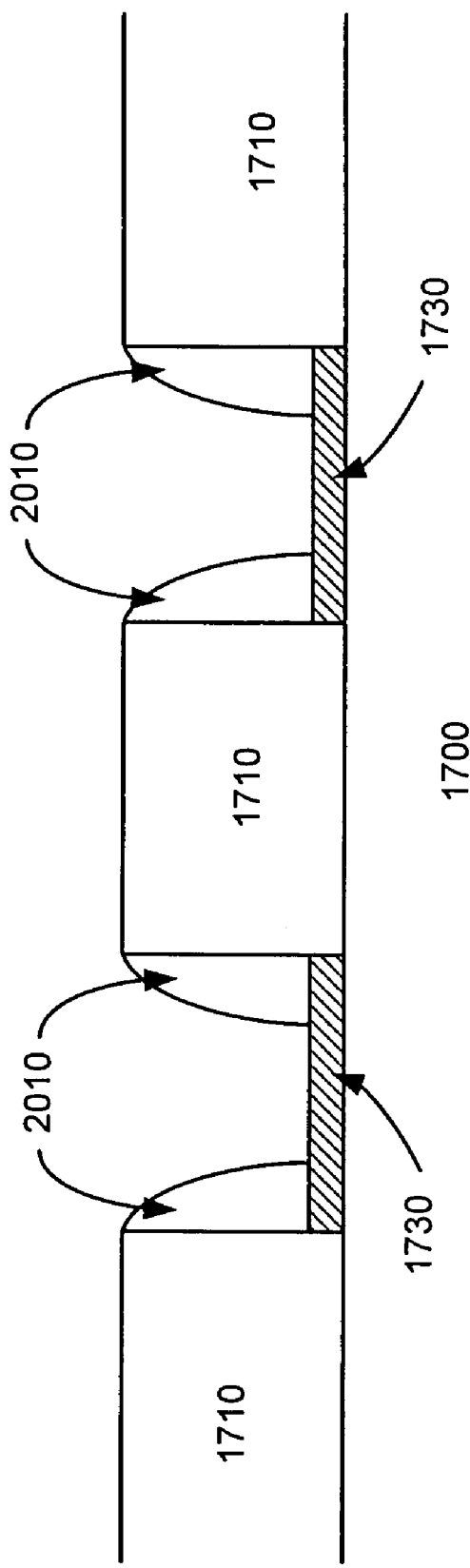
Figure 21:
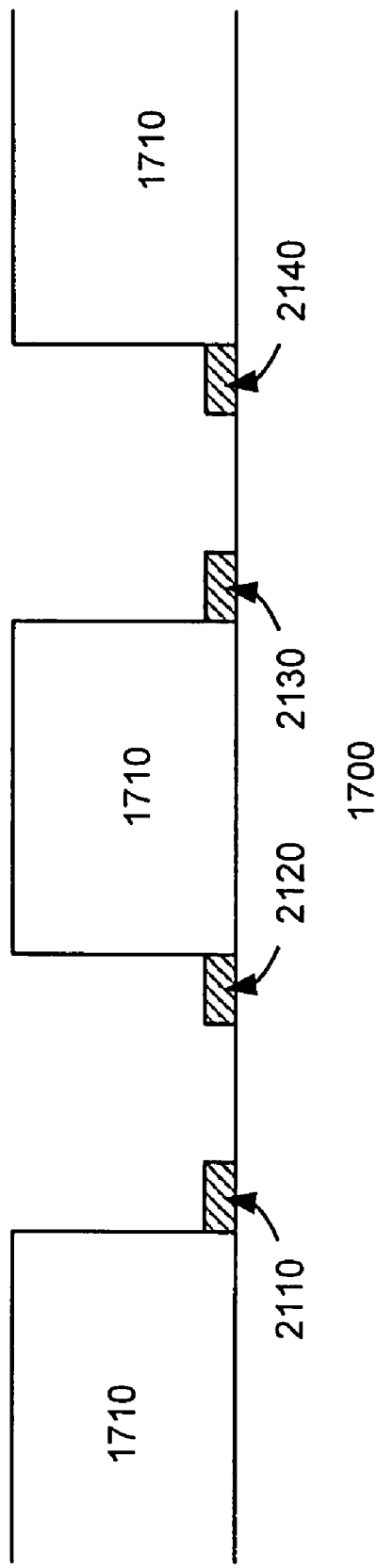

Sidewall spacers 2010 may be formed adjacent the sides of trenches 1720, as illustrated in FIG. 20. Spacers 2010 may be used to mask the polysilicon 1730 into 2 lines, as illustrated in FIG. 21. In this case, the portion of polysilicon 1730 located between spacers 2010 may be removed, followed by the removal of spacers 2010. In one implementation, lines 2110 and 2130 may be doped with n-type impurities. As will be described below, line 2110 may be used as a buried Vdd connection. Lines 2120 and 2140 may be doped with p-type impurities. Line 2120 may be used as a buried Vss connection and line 2140 may be used as a buried bitline.

Figure 22:
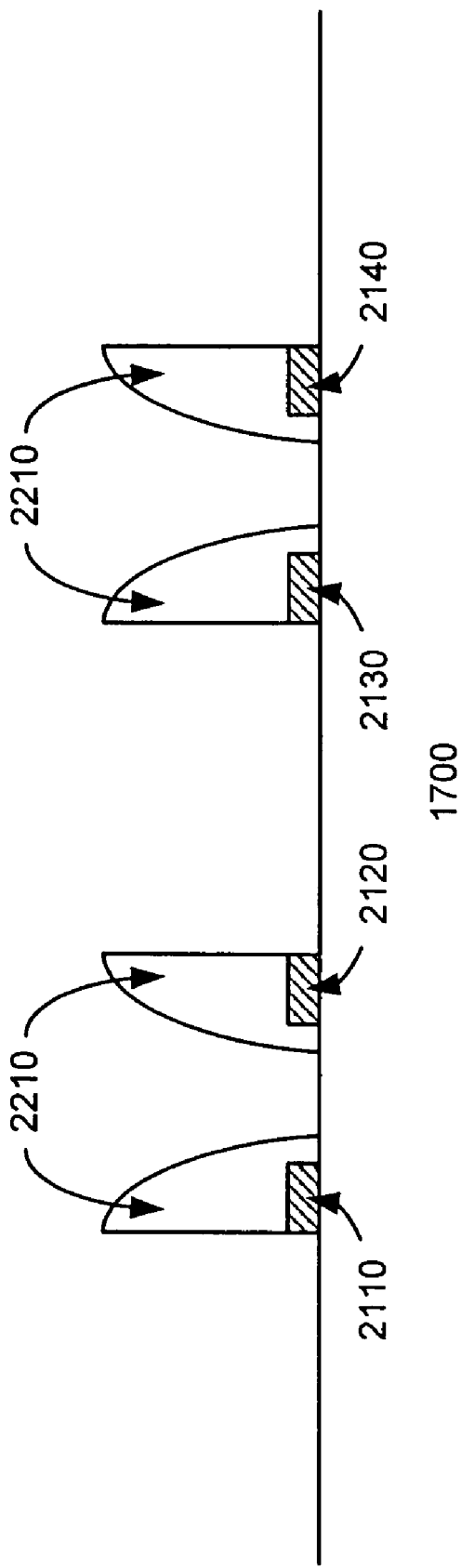
Figure 23:
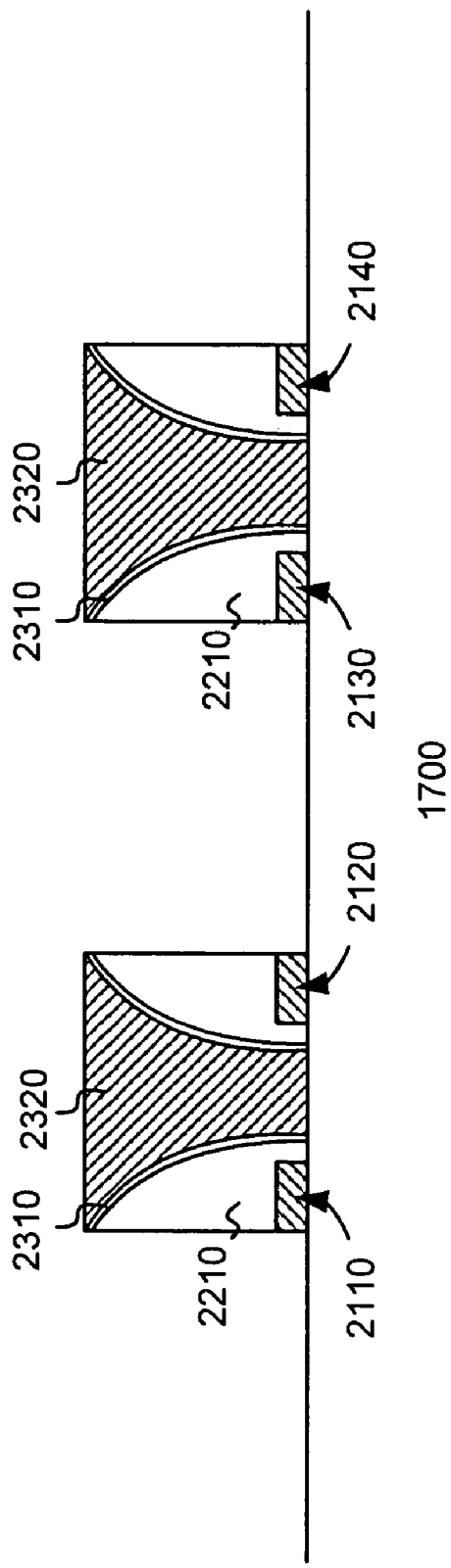

Sidewall spacers 2010 may be removed and a polysilicon layer may be deposited and etched to form spacers 2210, adjacent the side walls of trenches 1720 on substrate 1700, as illustrated in FIG. 22. The polysilicon material in spacers 2210 may then be re-crystallized. Trench walls 1710 may then be removed, as illustrated in FIG. 22. A gate dielectric layer 2310 may be deposited or thermally grown on polysilicon spacers 2210, as illustrated in FIG. 23. Gate dielectric layer 2310 may include conventional dielectric materials, such as an oxide (e.g., silicon dioxide). In other implementations, a nitride material, such as a silicon nitride, may be used as the gate dielectric material. Polysilicon 2320 may then be deposited in trenches 1720, as illustrated in FIG. 23.

Figure 24:
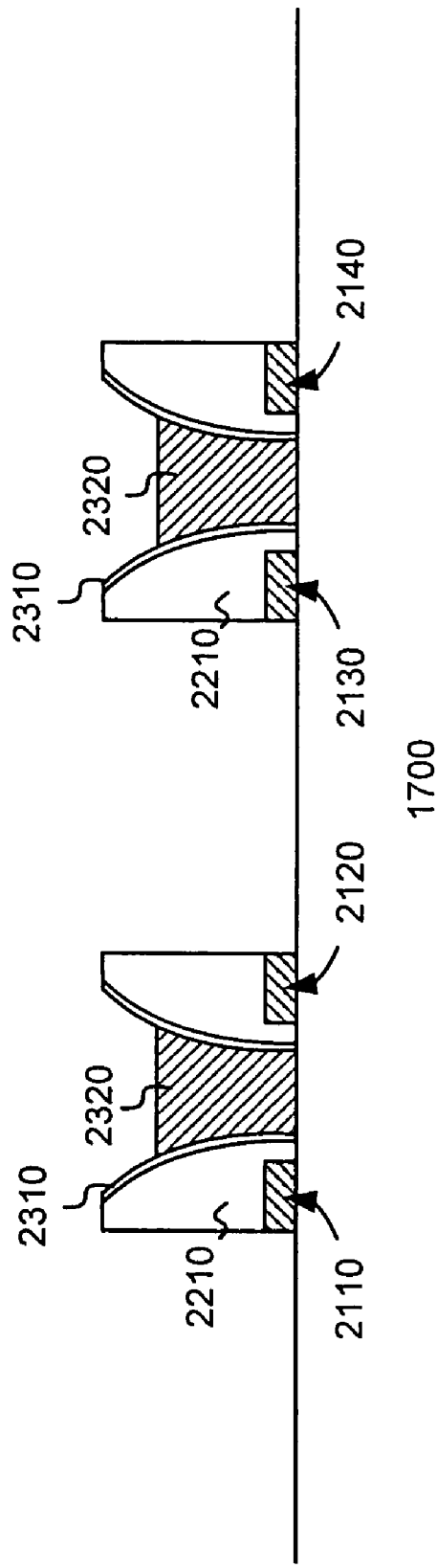
Figure 25:
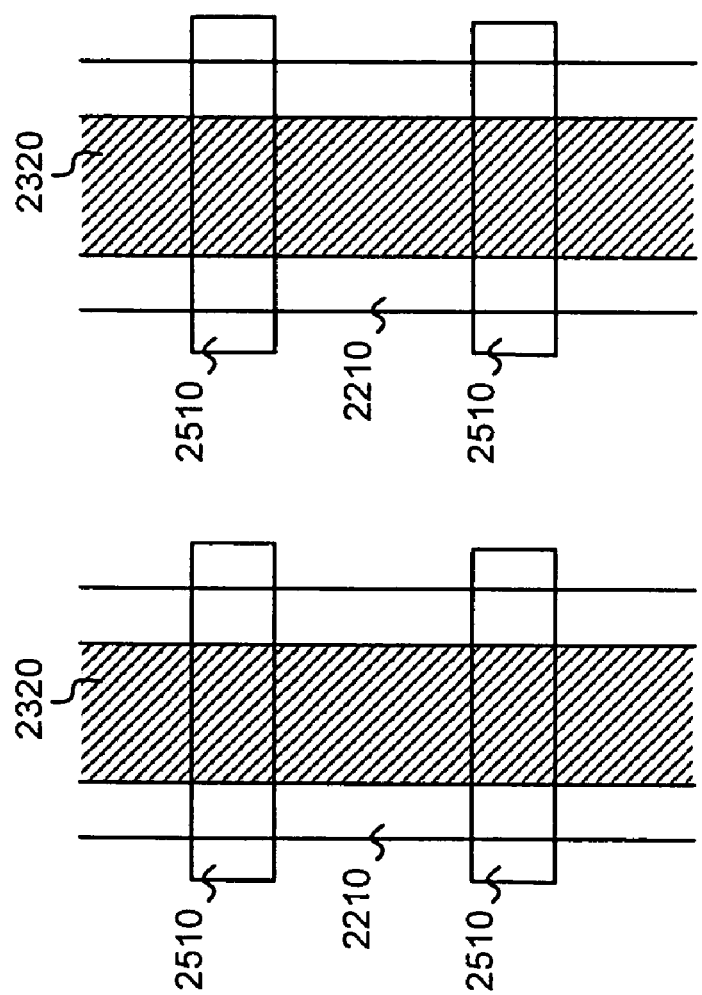
Figure 26A:
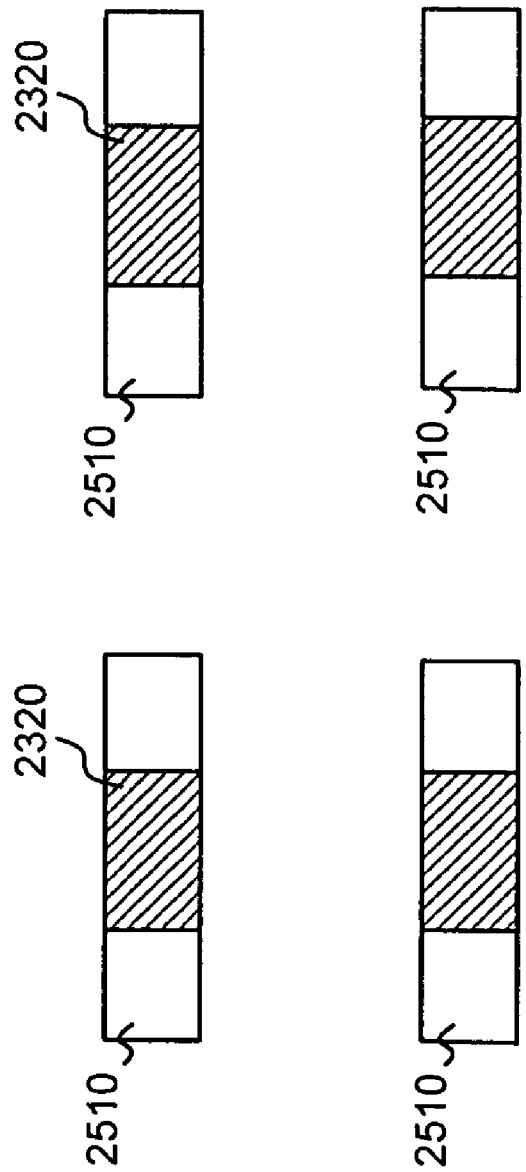
Figure 26B:
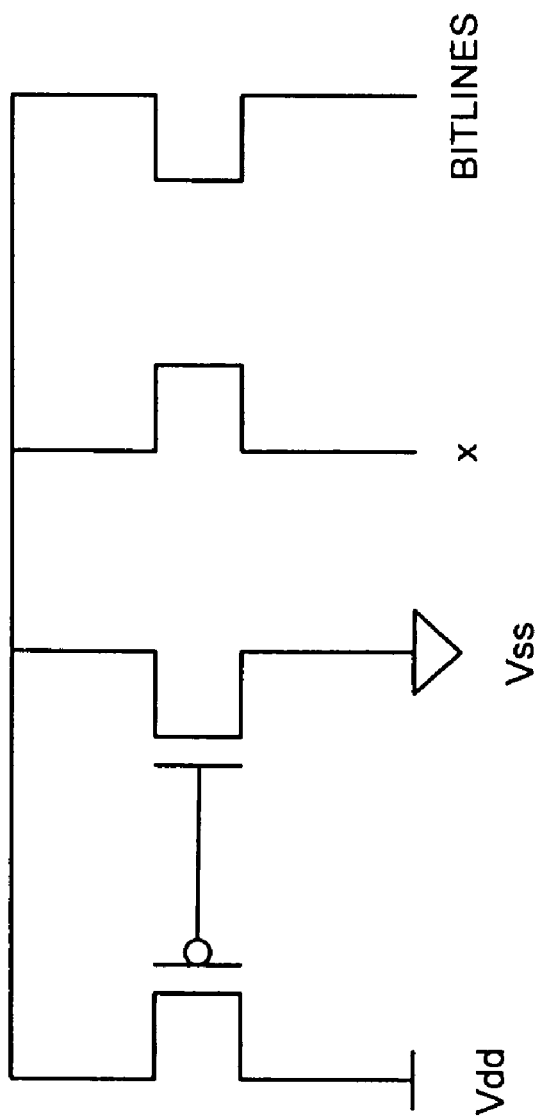
Figure 26C:
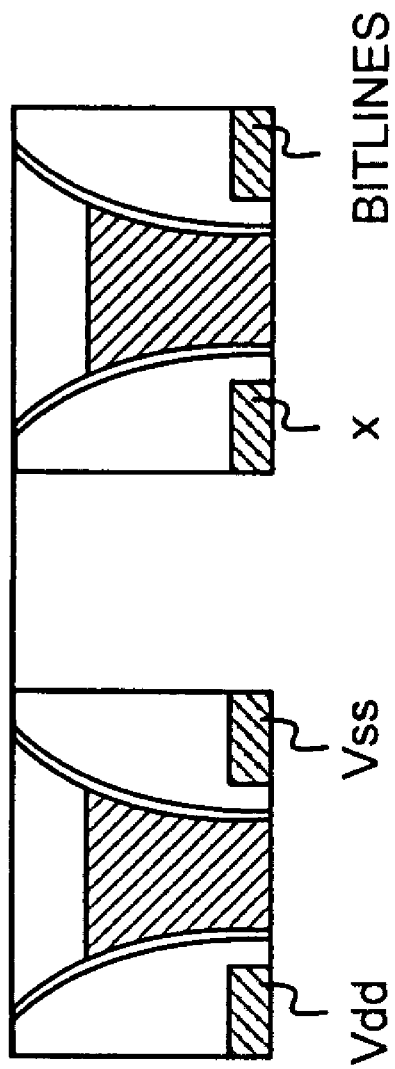

Polysilicon 2320 may be etched back to reduce the overall height of polysilicon 2320, as illustrated in FIG. 24. Spacers 2210 may be polished or etched to expose a top surface of the re-crystallized polysilicon in spacers 2210, as illustrated in FIG. 24. Metal layers 2510 may be deposited and masked, as illustrated by the exemplary top view of the semiconductor device shown in FIG. 25. In one implementation, metal layers 2510 may include nickel or another type of metal. The exposed portions of re-crystallized polysilicon 2210 and polysilicon 2320 may be removed, as illustrated in FIG. 26A. In one implementation, the exposed portions of re-crystallized polysilicon 2210 and polysilicon 2320 may be removed via etching to form multiple inverters with pass gates, as illustrated in FIG. 26B. FIG. 26C illustrates a cross sectional view of the semiconductor device illustrated in FIG. 26B. As illustrated, line 2110 (FIG. 21) acts as a buried Vdd connection, line 2120 acts as a buried Vss connection, and line 2140 acts as a buried bitline for the non-volatile memory device.

Figure 27:
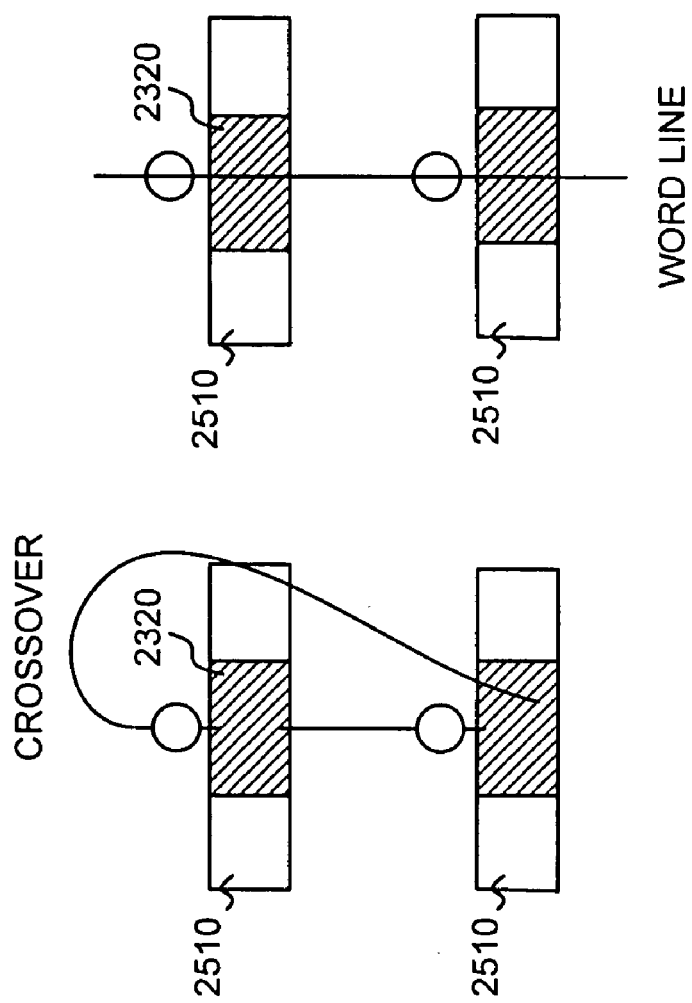

Contacts may be formed on polysilicon sections 2320 to form word lines and crossovers for the memory array, as illustrated in FIG. 27. In this way, an improved SRAM device can be formed.

CONCLUSION

Implementations consistent with the principles of the invention create N-channel and P-channel FinFET devices on a single fin structure. As a result, increased density for complimentary FinFET structures can be achieved.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While a series of acts has been described with regard to FIG. 1, the order of the acts may be varied in other implementations consistent with the present invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used.

The scope of the invention is defined by the claims and their equivalents.

What is claimed is:

1. A method for forming a semiconductor device, comprising:
   forming a fin structure;
   forming a source region at one end of the fin structure;
   forming a drain region at an opposite end of the fin structure;
   forming an insulating layer in the fin structure, source region, and drain region, the insulating layer separating the fin structure into a first fin structure and second fin structure, the source region into a first source region and a second source region, and the drain region into a first drain region and a second drain region, the first fin structure, the first source region, and the first drain region being formed on an opposite side of the insulating layer of the second fin structure, the second source region, and the second drain region;
   forming a gate dielectric layer on surfaces of the first and second fin structures, the first and second source regions, the first and second drain regions, and the insulating layer;
   removing portions of the gate dielectric layer to create covered portions and bare portions;
   depositing a gate material over the covered portions and bare portions;
   doping the first fin structure, the first source region, and the first drain region with a first material;
   doping the second fin structure, the second source region, and the second drain region with a second material; and
   selectively removing portions of the gate material to form the semiconductor device.

2. The method of claim 1 wherein the forming an insulating layer includes:
   forming the insulating layer to a width ranging from about 20 Å to about 30 Å.

3. The method of claim 1 wherein the forming a gate dielectric layer includes:
   forming the gate dielectric layer to a thickness ranging from about 10 Å to about 30 Å.

4. The method of claim 1 wherein the depositing a gate material includes:
   depositing the gate material to a thickness ranging from about 200 Å to about 1000 Å.

5. The method of claim 1 wherein a width of the covered portions of the gate dielectric layer ranges from about 100 Å to about 1000 Å.

6. The method of claim 1 wherein the first fin structure, first source region, and the first drain region are part of an N-channel device, and
   wherein the second fin structure, the second source region, and the second drain region are part of a P-channel device.

7. The method of claim 1 wherein the selectively removing portions of the gate material includes:
   removing a portion of the gate material located above the insulating layer in the source region of the semiconductor device.

8. The method of claim 7 wherein a width of the portion of gate material ranges from about 100 Å to about 1000 Å.

9. The method of claim 1 wherein the semiconductor device includes an inverter.

10. The method of claim 1 wherein the semiconductor device includes a NAND gate.

11. The method of claim 1 wherein the semiconductor device includes a NOR gate.

12. A method for forming a semiconductor device from a device that includes a first source region, a first drain region, and a first fin structure that are separated from a second source region, a second drain region, and a second fin structure by an insulating layer, the method comprising:
    forming an oxide layer over the device;
    removing portions of the oxide layer to create alternating covered portions and bare portions;
    depositing a gate material over the alternating covered portions and bare portions;
    doping the first fin structure, the first source region, and the first drain region with a first material;
    doping the second fin structure, the second source region, and the second drain region with a second material; and
    removing a portion of the gate material above the insulating layer and over at least one covered portion to form the semiconductor device.

13. The method of claim 12 wherein the forming an oxide layer includes:
    forming the oxide layer to a thickness ranging from about 100 Å to about 500 Å.

14. The method of claim 12 wherein a width of at least one covered portion ranges from about 100 Å to about 500 Å.

15. The method of claim 12 wherein the first material includes n-type impurities, and
    wherein the second material includes p-type impurities.

16. The method of claim 12 wherein the removing a portion of the gate material includes:
    removing a portion of the gate material to isolate gate material on one side of the insulating layer from gate material on an opposite side of the insulating layer.

17. The method of claim 16 wherein a width of the removed portion ranges from about 100 Å to about 500 Å.

18. A method for forming a semiconductor device from a device that includes a first source region, a first drain region, and a first fin structure that are separated from a second source region, a second drain region, and a second fin structure by an insulating layer, the method comprising:
    forming a dielectric layer over the device;
    removing portions of the dielectric layer to create covered portions and bare portions;
    depositing a gate material over the covered portions and bare portions;
    doping the first fin structure, the first source region, and the first drain region with a first material;
    doping the second fin structure, the second source region, and the second drain region with a second material; and
    removing a portion of the gate material over at least one covered portion to form the semiconductor device.

19. The method of claim 18 wherein the removing a portion of the gate material includes:
    removing the portion of gate material positioned above the insulating layer.

20. The method of claim 18 wherein the first material includes n-type impurities, and wherein the second material includes p-type impurities.

* * * * *